(12) United States Patent
Danek et al.

(10) Patent No.: US 8,709,948 B2
(45) Date of Patent: Apr. 29, 2014

(54) TUNGSTEN BARRIER AND SEED FOR COPPER FILLED TSV

(75) Inventors: Michal Danek, Cupertino, CA (US); Tom Mountsier, San Jose, CA (US); Jonathan Reid, Sherwood, OR (US); Juwen Gao, San Jose, CA (US); Aaron Fellis, San Jose, CA (US)

(73) Assignee: Novellus Systems, Inc., Fremont, CA (US)

( * ) Notice: Subject to any disclaimer, the term of this patent is extended or adjusted under 35 U.S.C. 154(b) by 848 days.

(21) Appl. No.: 12/723,532

(22) Filed: Mar. 12, 2010

(65) Prior Publication Data
US 2011/0221044 A1 Sep. 15, 2011

(51) Int. Cl.
*H01L 21/44* (2006.01)

(52) U.S. Cl.
USPC .......................................... 438/672; 438/678

(58) Field of Classification Search
USPC ................................................. 438/672, 678
See application file for complete search history.

(56) References Cited

U.S. PATENT DOCUMENTS

| | | | |
|---|---|---|---|
| 4,746,375 A | 5/1988 | Lacovangelo |
| 4,804,560 A | 2/1989 | Shioya et al. |
| 4,874,719 A | 10/1989 | Kuroawa |
| 5,028,565 A | 7/1991 | Chang et al. |
| 5,227,329 A | 7/1993 | Kobayashi et al. |
| 5,250,329 A | 10/1993 | Miracky et al. |
| 5,326,723 A | 7/1994 | Petro et al. |
| 5,391,394 A | 2/1995 | Hansen |
| 5,661,080 A | 8/1997 | Hwang et al. |
| 5,726,096 A | 3/1998 | Jung |
| 5,795,824 A | 8/1998 | Hancock |
| 5,804,249 A | 9/1998 | Sukharev et al. |
| 5,817,576 A | 10/1998 | Tseng et al. |
| 5,926,720 A | 7/1999 | Zhao et al. |
| 5,956,609 A | 9/1999 | Lee et al. |
| 6,001,729 A | 12/1999 | Shinriki et al. |
| 6,017,818 A | 1/2000 | Lu |
| 6,037,263 A | 3/2000 | Chang |
| 6,066,366 A | 5/2000 | Berenbaum et al. |
| 6,099,904 A | 8/2000 | Mak et al. |

(Continued)

FOREIGN PATENT DOCUMENTS

| | | |
|---|---|---|
| JP | 08-115984 | 5/1996 |
| JP | 2005-518088 | 6/2005 |

(Continued)

OTHER PUBLICATIONS

Ashtiani et al., "Ternary Tungsten-Containing Resistive Thin Films," Novellus Systems, Inc., U.S. Appl. No. 12/363,330, filed Jan. 30, 2009.

(Continued)

*Primary Examiner* — Samuel Gebremariam
(74) *Attorney, Agent, or Firm* — Weaver Austin Villeneuve & Sampson LLP

(57) ABSTRACT

Apparatus and methods for filling through silicon vias (TSV's) with copper having an intervening tungsten layer between the copper plug and the silicon are disclosed. Methods are useful for Damascene processing, with or without a TSV feature. The tungsten layer serves as a diffusion barrier, a seed layer for copper electrofill and a means of reducing CTE-induced stresses between copper and silicon. Adhesion of the tungsten layer to the silicon and of the copper layer to the tungsten is described.

25 Claims, 8 Drawing Sheets

(56) References Cited

U.S. PATENT DOCUMENTS

| | | | |
|---|---|---|---|
| 6,107,200 A | 8/2000 | Takagi et al. | |
| 6,143,082 A | 11/2000 | McInerney et al. | |
| 6,174,812 B1 | 1/2001 | Hsiung et al. | |
| 6,206,967 B1 | 3/2001 | Mak et al. | |
| 6,245,654 B1 | 6/2001 | Shih et al. | |
| 6,265,312 B1 | 7/2001 | Sidhwa et al. | |
| 6,277,744 B1 | 8/2001 | Yuan et al. | |
| 6,294,468 B1 | 9/2001 | Gould-Choquette et al. | |
| 6,297,152 B1 | 10/2001 | Itoh et al. | |
| 6,309,966 B1 | 10/2001 | Govindarajan et al. | |
| 6,310,300 B1 * | 10/2001 | Cooney et al. | 174/258 |
| 6,355,558 B1 | 3/2002 | Dixit et al. | |
| 6,404,054 B1 | 6/2002 | Oh et al. | |
| 6,429,126 B1 | 8/2002 | Herner et al. | |
| 6,465,347 B2 | 10/2002 | Ishizuka et al. | |
| 6,551,929 B1 | 4/2003 | Kori et al. | |
| 6,566,250 B1 | 5/2003 | Tu et al. | |
| 6,566,262 B1 | 5/2003 | Rissman et al. | |
| 6,593,233 B1 | 7/2003 | Miyazaki et al. | |
| 6,607,976 B2 | 8/2003 | Chen et al. | |
| 6,627,066 B1 | 9/2003 | Isayama et al. | |
| 6,635,965 B1 | 10/2003 | Lee et al. | |
| 6,706,625 B1 | 3/2004 | Sudijono et al. | |
| 6,720,261 B1 | 4/2004 | Anderson et al. | |
| 6,740,221 B2 | 5/2004 | Cheung et al. | |
| 6,740,585 B2 | 5/2004 | Yoon et al. | |
| 6,797,340 B2 | 9/2004 | Fang et al. | |
| 6,827,839 B2 | 12/2004 | Sonnenberg et al. | |
| 6,844,258 B1 | 1/2005 | Fair et al. | |
| 6,861,356 B2 | 3/2005 | Matsuse et al. | |
| 6,902,763 B1 | 6/2005 | Elers et al. | |
| 6,905,543 B1 | 6/2005 | Fair et al. | |
| 6,908,848 B2 | 6/2005 | Koo | |
| 6,936,538 B2 | 8/2005 | Byun | |
| 6,939,804 B2 | 9/2005 | Lai et al. | |
| 6,962,873 B1 | 11/2005 | Park | |
| 7,005,372 B2 | 2/2006 | Levy et al. | |
| 7,141,494 B2 | 11/2006 | Lee et al. | |
| 7,144,488 B2 | 12/2006 | Binstead et al. | |
| 7,157,798 B1 | 1/2007 | Fair et al. | |
| 7,211,144 B2 | 5/2007 | Lu et al. | |
| 7,220,671 B2 | 5/2007 | Simka et al. | |
| 7,262,125 B2 | 8/2007 | Wongsenakhum et al. | |
| 7,416,979 B2 | 8/2008 | Yoon et al. | |
| 7,429,402 B2 | 9/2008 | Gandikota et al. | |
| 7,589,017 B2 | 9/2009 | Chan et al. | |
| 7,655,567 B1 | 2/2010 | Gao et al. | |
| 7,691,749 B2 | 4/2010 | Levy et al. | |
| 7,754,604 B2 | 7/2010 | Wongsenakhum et al. | |
| 7,772,114 B2 | 8/2010 | Chan et al. | |
| 7,955,972 B2 | 6/2011 | Chan et al. | |
| 7,977,243 B2 * | 7/2011 | Sakamoto et al. | 438/694 |
| 8,048,805 B2 | 11/2011 | Chan et al. | |
| 8,053,365 B2 | 11/2011 | Humayun et al. | |
| 8,058,170 B2 | 11/2011 | Chandrashekar et al. | |
| 8,062,977 B1 | 11/2011 | Ashtiani et al. | |
| 8,101,521 B1 | 1/2012 | Gao et al. | |
| 8,110,877 B2 | 2/2012 | Mukherjee et al. | |
| 8,207,062 B2 | 6/2012 | Gao et al. | |
| 8,258,057 B2 | 9/2012 | Kuhn et al. | |
| 8,329,576 B2 | 12/2012 | Chan et al. | |
| 8,367,546 B2 | 2/2013 | Humayun et al. | |
| 8,409,985 B2 | 4/2013 | Chan et al. | |
| 8,409,987 B2 | 4/2013 | Chandrashekar et al. | |
| 8,551,885 B2 | 10/2013 | Chen et al. | |
| 2001/0008808 A1 | 7/2001 | Gonzalez | |
| 2001/0014533 A1 | 8/2001 | Sun | |
| 2001/0015494 A1 | 8/2001 | Ahn | |
| 2001/0044041 A1 | 11/2001 | Badding et al. | |
| 2002/0037630 A1 | 3/2002 | Agarwal et al. | |
| 2002/0090796 A1 | 7/2002 | Desai et al. | |
| 2002/0117399 A1 | 8/2002 | Chen et al. | |
| 2002/0132472 A1 | 9/2002 | Park | |
| 2002/0155722 A1 | 10/2002 | Satta et al. | |
| 2002/0177316 A1 | 11/2002 | Miller et al. | |
| 2003/0059980 A1 | 3/2003 | Chen et al. | |
| 2003/0104126 A1 | 6/2003 | Fang et al. | |
| 2003/0127043 A1 | 7/2003 | Lu et al. | |
| 2003/0190802 A1 | 10/2003 | Wang et al. | |
| 2004/0014315 A1 | 1/2004 | Lai et al. | |
| 2004/0044127 A1 | 3/2004 | Okubo et al. | |
| 2004/0142557 A1 | 7/2004 | Levy et al. | |
| 2004/0202786 A1 | 10/2004 | Wongsenakhum et al. | |
| 2004/0206267 A1 | 10/2004 | Sambasivan et al. | |
| 2005/0031786 A1 | 2/2005 | Lee et al. | |
| 2005/0059236 A1 | 3/2005 | Nishida et al. | |
| 2005/0136594 A1 | 6/2005 | Kim | |
| 2005/0179141 A1 | 8/2005 | Yun et al. | |
| 2005/0191803 A1 | 9/2005 | Matsuse et al. | |
| 2006/0003581 A1 | 1/2006 | Johnston et al. | |
| 2006/0075966 A1 | 4/2006 | Chen et al. | |
| 2006/0094238 A1 | 5/2006 | Levy et al. | |
| 2007/0099420 A1 | 5/2007 | Dominquez et al. | |
| 2007/0190780 A1 | 8/2007 | Chung et al. | |
| 2008/0045010 A1 * | 2/2008 | Wongsenakhum et al. | 438/656 |
| 2008/0081127 A1 | 4/2008 | Thompson et al. | |
| 2008/0124926 A1 | 5/2008 | Chan et al. | |
| 2008/0254623 A1 | 10/2008 | Chan et al. | |
| 2008/0280438 A1 | 11/2008 | Lai et al. | |
| 2009/0053893 A1 | 2/2009 | Khandelwal et al. | |
| 2009/0057151 A1 | 3/2009 | Shalyt et al. | |
| 2009/0149022 A1 | 6/2009 | Chan et al. | |
| 2009/0160030 A1 * | 6/2009 | Tuttle | 257/621 |
| 2009/0163025 A1 | 6/2009 | Humayun et al. | |
| 2009/0315154 A1 * | 12/2009 | Kirby et al. | 257/621 |
| 2010/0035427 A1 | 2/2010 | Chan et al. | |
| 2010/0055904 A1 | 3/2010 | Chen et al. | |
| 2010/0130003 A1 * | 5/2010 | Lin et al. | 438/637 |
| 2010/0159694 A1 | 6/2010 | Chandrashekar et al. | |
| 2010/0267230 A1 | 10/2010 | Chandrashekar et al. | |
| 2010/0267235 A1 | 10/2010 | Chen et al. | |
| 2010/0273327 A1 | 10/2010 | Chan et al. | |
| 2011/0059608 A1 | 3/2011 | Gao et al. | |
| 2011/0156154 A1 | 6/2011 | Hoentschel et al. | |
| 2011/0221044 A1 | 9/2011 | Danek et al. | |
| 2011/0223763 A1 | 9/2011 | Chan et al. | |
| 2011/0233778 A1 | 9/2011 | Lee et al. | |
| 2012/0009785 A1 | 1/2012 | Chandrashekar et al. | |
| 2012/0015518 A1 | 1/2012 | Chandrashekar et al. | |
| 2012/0040530 A1 | 2/2012 | Humayun et al. | |
| 2012/0199887 A1 | 8/2012 | Chan et al. | |
| 2012/0231626 A1 | 9/2012 | Lee et al. | |
| 2012/0244699 A1 | 9/2012 | Khandelwal et al. | |
| 2013/0161203 A1 | 6/2013 | Mayer | |
| 2013/0168864 A1 | 7/2013 | Lee et al. | |
| 2013/0171822 A1 | 7/2013 | Chandrashekar et al. | |

FOREIGN PATENT DOCUMENTS

| | | |
|---|---|---|
| JP | 2007-251164 | 9/2007 |
| JP | 2009-144242 | 7/2009 |
| KR | 20050022261 | 3/2005 |
| KR | 20050087428 | 8/2005 |
| KR | 10-2006-0074593 | 7/2006 |
| KR | 10-2006-0087844 | 8/2006 |
| KR | 10-2007-0012525 | 1/2007 |
| KR | 20080110897 | 12/2008 |
| WO | WO01/27347 | 4/2001 |
| WO | WO 01/29893 | 4/2001 |
| WO | WO 03/029515 | 4/2003 |
| WO | WO 2005/027211 | 3/2005 |
| WO | 2007/121249 | 10/2007 |
| WO | WO2010/025357 | 3/2010 |
| WO | WO 2013/090295 | 6/2013 |

OTHER PUBLICATIONS

Chan et al., "Method for Improving Uniformity and Adhesion of Low Resistivity Tungsten Film," Novellus Systems, Inc., U.S. Appl. No. 12/829,119, filed Jul. 1, 2010.

U.S. Final Office Action dated Oct. 19, 2010, issued in U.S. Appl. No. 12/407,541.

U.S. Office Action dated May 2, 2011, issued in U.S. Appl. No. 12/407,541.

(56) References Cited

OTHER PUBLICATIONS

U.S. Office Action dated May 13, 2011issued in U.S. Appl. No. 12/755,248.
U.S. Office Action dated Jun. 14, 2011, issued in U.S. Appl. No. 12/556,490.
U.S. Final Office Action dated Jun. 15, 2011, issued in U.S. Appl. No. 12/636,616.
U.S. Notice of Allowance dated Jun. 30, 2011, issued in U.S. Appl. No. 12/538,770.
U.S. Office Action dated Jun. 30, 2011, issued in U.S. Appl. No. 12/829,119.
U.S. Notice of Allowance dated Jul. 25, 2011, issued in U.S. Appl. No. 12/363,330.
KR First Notification of Provisional Rejection dated Dec. 8, 2010, issued in Application No. 2004-0036346.
U.S. Notice of Allowance dated Sep. 2, 2011, issued in U.S. Appl. No. 11/963,698.
U.S. Notice of Allowance dated Sep. 19, 2011, issued in U.S. Appl. No. 12/407,541.
Chan et al., "Methods of Controlling Tungsten Film Properties," Novellus Systems, Inc., U.S. Appl. No. 13/020,748, filed Feb. 3, 2011.
Chandrashekar et al., "Method for Depositing Thin Tungsten Film With Low Resistivity and Robust Micro-Adhesion Characteristics," Novellus Systems, Inc., U.S. Appl. No. 13/244,016, filed Sep. 23, 2011.
U.S. Office Action dated Oct. 28, 2011, issued in U.S. Appl. No. 12/755,248.
U.S. Notice of Allowance dated Sep. 30, 2011, issued in U.S. Appl. No. 12/636,616.
Humayun et al., "Methods for Forming All Tungsten Contacts and Lines," Novellus Systems, Inc., U.S. Appl. No. 13/276,170, filed Oct. 18, 2011.
U.S. Final Office Action dated Nov. 17, 2011, issued in U.S. Appl. No. 12/829,119.
U.S. Office Action dated Feb. 16, 2012, issued in U.S. Appl. No. 12/755,259.
U.S. Notice of Allowance dated Mar. 2, 2012, issued in U.S. Appl. No. 12/556,490.
U.S. Office Action dated May 10, 2012, issued in U.S. Appl. No. 13/020,748.
U.S. Office Action dated Mar. 6, 2012, issued in U.S. Appl. No. 13/244,016.
U.S. Office Action dated Apr. 19, 2012, issued in U.S. Appl. No. 12/829,119.
U.S. Office Action dated Apr. 16, 2012, issued in U.S. Appl. No. 13/276,170.
U.S. Final Office Action dated Apr. 30, 2012, issued in U.S. Appl. No. 12/755,248.
KR Notification of Provisional Rejection dated Jul. 17, 2012, issued in Application No. 2010-0087997.
U.S. Office Action dated Aug. 6, 2012, issued in U.S. Appl. No. 13/095,734.
U.S. Notice of Allowance dated Aug. 7, 2012, issued in U.S. Appl. No. 12/829,119.
KR Notification of Provisional Rejection dated Sep. 6, 2012, issued in Application No. 2011-7004322.
U.S. Final Office Action dated Sep. 12, 2012, issued in U.S. Appl. No. 12/755,259.
Bell et al., "Batch Reactor Kinetic Studies of Tungsten LPCVD from Silane and Tungsten Hexafluoride", J. Electrochem. Soc., Jan. 1996, vol. 143, No. 1, pp. 296-302.
Collins et al., "Pulsed Deposition of Ultra Thin Tungsten for Plugfill of High Aspect Ratio Contacts," Presentation made at Semicon Korea 2003, Jan. 21, 2003, 9 pages.
Collins, et al., "Pulsed Deposition of Ultra Thin Tungsten for Plugfill of High Aspect Ratio Contacts," Semiconductor Equipment and Materials International, Semicon Korea, Jan. 21, 2003, 3 pages.
Elam et al, "Nucleation and Growth During Tungsten Atomic Layer Deposition on $SiO_2$ Surfaces," Thin Solid Films, 2001, 13 Pages.
George et al., "Surface Chemistry for atomic Layer Growth", J. Phys. Chem, 1996, vol. 100, No. 31, pp. 13121-13131.
Hoover, Cynthia, "Enabling Materials for Contact Metallization," Praxair Electronic Materials R&D, Jul. 2007, pp. 1-16.
International Search Report and Written Opinion mailed Apr. 12, 2010 from Application No. PCT/US2009/055349.
Ken K. Lai and H. Henry Lamb, Precursors for Organometallic Chemical Vapor Deposition of Tungsten Carbide Films, 1995, Chemistry Material, pp. 2284-2292.
Klaus et al., "Atomic layer deposition of tungsten using sequential surface chemistry with a sacrificial stripping reaction", Thin Solid Films 360 (2000) 145-153.
Klaus et al., "Atomically Controlled Growth of Tungsten and Tungsten Nitride Using Sequential Surface Reactions," Applied Surface Science, 162-163, (2000) 479-491.
Lee et al., Pulsed Deposition of Ultra Thin Tungsten and its Application for Plugfill of High Aspect Ratio Contacts, Abstract, Jan. 21, 2003, 1 page.
Lee et al., PCT Search Report, Completed Oct. 15, 2004, PCT/US2004/006940, Int'l filing date May 3, 2004.
Lee et al., Written Opinion, Completed Oct. 15, 2004, PCT/US2004/006940, Int'l filing date May 3, 2004.
Li et al., "Deposition of $WN_xC_y$ Thin Films by ALCVD™ Method for Diffusion Barriers in Metallization," IITC Conference Report, 2002, 3 Pages.
Presentation by Inventor James Fair: "Chemical Vapor Deposition of Refractory Metal Silicides," 27 Pages, 1983.
Purchase of ethylcyclopentadienyl)dicarbonylnitrosyltungsten from Praxair in Oct. 2006.
Saito et al., "A Novel Copper Interconnection Technology Using Self Aligned Metal Capping Method," IEEE, 3 Pages, 2001.
U.S. Office Action mailed Jul. 17, 2002, from U.S. Appl. No. 09/975,074.
Allowed Claims from U.S. Appl. No. 09/975,074.
Notice of Allowance and Fee Due mailed Mar. 12, 2003, from U.S Appl. No. 09/975,074.
U.S. Office Action mailed Jun. 22, 2004, from U.S. Appl. No. 10/435,010.
Allowed Claims from U.S. Appl. No. 10/435,010.
Notice of Allowance and Fee Due mailed Oct. 7, 2004, from U.S. Appl. No. 10/435,010.
U.S. Office Action mailed Feb. 8, 2005, from U.S. Appl. No. 10/649,351.
U.S. Office Action mailed Dec. 30, 2005, from U.S. Appl. No. 10/649,351.
U.S. Final Office Action mailed Jul. 14, 2005, from U.S. Appl. No. 10/649,351.
Allowed Claims from U.S. Appl. No. 10/649,351.
Notice of Allowance and Fee Due mailed Jul. 21, 2006, from U.S. Appl. No. 10/649,351.
U.S. Office Action mailed Mar. 23, 2005, from U.S. Appl. No. 10/690,492.
Allowed Claims from U.S. Appl. No. 10/690,492.
Notice of Allowance and Fee Due mailed Sep. 14, 2005, from U.S. Appl. No. 10/690,492.
U.S. Office Action mailed Jul. 12, 2005, from U.S. Appl. No. 10/815,560.
U.S. Final Office Action mailed Dec. 28, 2005, from U.S. Appl. No. 10/815,560.
U.S. Office Action mailed Apr. 17, 2006, from U.S. Appl. No. 10/815,560.
U.S. Office Action mailed Sep. 28, 2006, from U.S. Appl. No. 10/815,560.
Allowed Claims from U.S. Appl. No. 10/815,560.
Notice of Allowance and Fee Due mailed Apr. 24, 2007, from U.S. Appl. No. 10/815,560.
U.S. Office Action mailed Nov. 23, 2005, from U.S. Appl. No. 10/984,126.
U.S. Final Office Action mailed May 17, 2006, from U.S. Appl. No. 10/984,126.
Allowed Claims from U.S. Appl. No. 10/984,126.
Notice of Allowance and Fee Due mailed Aug. 25, 2006, from U.S. Appl. No. 10/984,126.

(56) References Cited

OTHER PUBLICATIONS

U.S. Office Action mailed Aug. 21, 2008, from U.S. Appl. No. 11/265,531.
U.S. Final Office Action mailed Feb. 26, 2009, from U.S. Appl. No. 11/265,531.
Allowed Claims from U.S. Appl. No. 11/265,531.
U.S. Notice of Allowance mailed May 4, 2009 from U.S. Appl. No. 11/265,531.
U.S. Office Action mailed Jun. 27, 2008, from U.S. Appl. No. 11/305,368.
U.S. Office Action mailed Apr. 3, 2009, from U.S. Appl. No. 11/305,368.
Allowed Claims from U.S. Appl. No. 11/305,368.
U.S. Notice of Allowance mailed Nov. 17, 2009 from U.S. Appl. No. 11/305,368.
U.S. Office Action mailed Oct. 16, 2008, from U.S. Appl. No. 11/349,035.
U.S. Final Office Action mail Feb. 25, 2009, from U.S. Appl. No. 11/349,035.
U.S. Office Action mailed Jun. 4, 2009, from U.S. Appl. No. 11/349,035.
U.S. Final Office Action mailed Nov. 20, 2009 from U.S. Appl. No. 11/349,035.
Allowed Claims from U.S. Appl. No. 11/349,035.
U.S. Notice of Allowance mailed Mar. 2, 2010 from U.S. Appl. No. 11/349,035.
U.S. Office Action mailed Sep. 29, 2008, from U.S. Appl. No. 11/782,570.
U.S. Final Office Action mailed Apr. 28, 2009, from U.S. Appl. No. 11/782,570.
Allowed Claims from U.S. Appl. No. 11/782,570.
U.S. Notice of Allowance mailed Sep. 17, 2009 from U.S. Appl. No. 11/782,570.
U.S. Office Action mailed Aug. 5, 2009, from U.S. Appl. No. 11/951,236.
U.S. Office Action mailed Jan. 26, 2010 from U.S. Appl. No. 11/951,236.
U.S. Notice of Allowance and Allowed Claims mailed Apr. 6, 2010 from U.S. Appl. No. 11/951,236.
U.S. Office Action mailed Jun. 11, 2009, from U.S. Appl. No. 11/963,698.
U.S. Final Office Action mailed Dec. 9, 2009 from U.S. Appl. No. 11/963,698.
U.S. Office Action mailed Jun. 11, 2010 from U.S. Appl. No. 11/963,698.
U.S. Final Office Action for U.S. Appl. No. 11/963,698 mailed Dec. 30, 2010.
U.S. Office Action mailed Jun. 24, 2009 from U.S. Appl. No. 12/030,645.
U.S. Final Office Action mailed Jan. 13, 2010 from U.S. Appl. No. 12/030,645.
U.S. Final Office Action mailed Jul. 23, 2010 from U.S. Appl. No. 12/030,645.
Allowed Claims from U.S. Appl. No. 12/030,645 as of Jan. 24, 2011.
Notice of Allowance and Fee Due mailed Jan. 24, 2011, from U.S. Appl. No. 12/030,645.
U.S. Office Action mailed Oct. 21, 2009 from U.S. Appl. No. 12/202,126.
U.S. Final Office Action mailed May 7, 2010 from U.S. Appl. No. 12/202,126.
U.S. Office Action mailed Jul. 26, 2010 from U.S. Appl. No. 12/202,126.
U.S. Final Office Action mailed Feb. 7, 2011 from U.S. Appl. No. 12/202,126.
U.S. Office Action mailed May 3, 2010 from U.S. Appl. No. 12/407,541.
U.S. Final Office Action mailed Oct. 19, 2010 from U.S. Appl. No. 12/407,541.
U.S. Office Action for U.S. Appl. No. 12/538,770 mailed Nov. 23, 2010.
U.S. Office Action for U.S. Appl. No. 12/636,616 mailed Jan. 25, 2011.
Ashtiani et al., "Ternary Tungsten-Containing Thin Film Heater Elements," Novellus Systems, Inc., U.S. Appl. No. 61/025,237, filed Jan. 31, 2008.
Chan et al., "Method for Improving Uniformity and Adhesion of Low Resistivity Tungsten Film," Novellus Systems, Inc., U.S. Appl. No. 11/951,236, filed Dec. 5, 2007.
Chan et al., "Methods for Growing Low-Resistivity Tungsten Film," Novellus Systems, Inc., U.S. Appl. No. 11/265,531, filed Nov. 1, 2005.
Chan et al., "Methods for Growing Low-Resistivity Tungsten for High Aspect Ratio and Small Features," Novellus Systems, Inc., U.S. Appl. No. 12/030,645, filed Feb. 13, 2008.
Chan et al., "Methods for Growing Low-Resistivity Tungsten Filml", Novellus Systems Inc., U.S. Appl. No. 12/538,770, filed Aug. 10, 2009.
Chan et al., "Methods for Growing Low-Resistivity Tungsten for High Aspect Ratio and Small Features," Novellus Systems, Inc., U.S. Appl. No. 13/095,734, filed Apr. 25, 2011.
Chandrashekar et al., "Method for depositing thin tungsten film with low resistivity and robust micro-adhesion characteristics," Novellus Systems, Inc., U.S. Appl. No. 61/061,078, filed Jun. 12, 2008.
Chandrashekar et al., "Method for Depositing Thin Tungsten Film With Low Resistivity and Robust Micro-Adhesion Characteristics," Novellus Systems, Inc., U.S. Appl. No. 12/407,541, filed Mar. 19, 2009.
Chandrashekar, et al., "Method for Forming Tungsten Contacts and Interconnects with Small Critical Dimensions," Novellus Systems, Inc, filed Apr. 6, 2010, U.S. Appl. No. 12/755,248.
Chen et al., "Method for Reducing Tungsten Roughness and Improving Reflectivity," Novellus Systems, Inc., U.S. Appl. No. 12/202,126, filed Aug. 29, 2008.
Chen, et al., "Methods for Depositing Ultra Thin Low Resistivity Tungsten Film for Small Critical Dimension Contacts and Interconnects," Novellus Systems, Inc, filed Apr. 6, 2010, U.S. Appl. No. 12/755,259.
Danek, et al, "Tungsten Barrier and Seed for Copper Filled TSV," Novellus Systems, Inc., filed Mar. 12, 2010, U.S. Appl. No. 12/723,532.
Fair et al., "Selective Refractory Metal and Nitride Capping," Novellus Systems, Inc., U.S. Appl. No. 10/435,010, filed May 9, 2003.
Fair et al., "Selective Refractory Metal and Nitride Capping," Novellus Systems, Inc., U.S. Appl. No. 10/984,126, filed Nov. 8, 2004.
Gao et al., "Method for Improving Adhesion of Low Resistivity Tungsten/Tungsten Nitride Layers," Novellus Systems, Inc., U.S. Appl. No. 12/556,490, filed Sep. 9, 2009.
Gao et al., "Methods for Improving Uniformity and Resistivity of Thin Tungsten Films," Novellus Systems, Inc, filed Jul. 24, 2007, U.S. Appl. No. 11/782,570, pp. 1-23.
Gao et al., "Methods for Improving Uniformity and Resistivity of Thin Tungsten Films," Novellus Systems, Inc, filed Dec. 11, 2009, U.S. Appl. No. 12/636,616.
Humayun et al., "Methods for Forming All Tungsten Contacts and Lines," Novellus Systems, Inc., U.S. Appl. No. 11/963,698, filed Dec. 21, 2007.
Lee et al., "Method for Producing Ultra Thin Tungsten Layer With Improved Step Coverage," Novellus Systems, Inc., U.S. Appl. No. 09/975,074, filed Oct. 9, 2001.
Lee et al., "Method for Producing Ultra Thin Tungsten Layer With Improved Step Coverage," Novellus Systems, Inc., U.S. Appl. No. 10/649,351, filed Aug. 26, 2003.
Levy et al., "Deposition of Tungsten Nitride," Novellus Systems, Inc., U.S. Appl. No. 10/690,492, filed Oct. 20, 2003.
Levy et al., "Deposition of Tungsten Nitride", Novellus Systems, Inc., filed Dec. 16, 2005, U.S. Appl. No. 11/305,368, pp. 1-39.
Wongsenakhum et al., "Method of Forming Low-Resistivity Tungsten Interconnects," Novellus Systems, Inc., U.S. Appl. No. 10/815,560, filed Mar. 31, 2004.
Wongsenakhum et al., "Reducing Silicon Attack and Improving Resistivity of Tungsten Nitride Film", Novellus Systems, Inc., filed Feb. 6, 2006, U.S. Appl. No. 11/349,035, pp. 1-26.

(56) References Cited

OTHER PUBLICATIONS

US Notice of Allowance dated Jul. 10, 2013 in U.S. Appl. No. 12/755,259.
US Notice of Allowance dated Sep. 4, 2013 in U.S. Appl. No. 12/755,259.
U.S. Appl. No. 13/862,048, filed Apr. 12, 2013, entitled "CVD Based Metal/Semiconductor OHMIC Contact for High Volume Manufacturing Applications,".
US Notice of Allowance, dated Jan. 19, 2005 in U.S. Appl. No. 10/435,010.
US Notice of Allowance, dated Jun. 7, 2013 in U.S. Appl. No. 12/202,126.
US Office Action, dated Jun. 20, 2013 in U.S. Appl. No. 13/650,688.
US Office Action, dated Jun. 14, 2013 in U.S. Appl. No. 13/633,798.
Korean Office Action, dated Nov. 24, 2010 in Application No. KR 10-2004-0013210.
Korean Office Action, dated Mar. 28, 2013 in Application No. KR 10-2007-0012027.
Japanese Office Action dated May 7, 2013 in Application No. JP 2008-310322.
Chinese Office Action dated Aug. 7, 2013 in application No. 200980133560.1.
Korean Office Action dated Jul. 18, 2013 in application No. 2011-7004322.
PCT International Search Report and Written Opinion, dated Mar. 28, 2013, in PCT/US2012/069016.
PCT International Search Report and Written Opinion, dated Jun. 28, 2013, in PCT/US2013/033174.
PCT International Search Report and Written Opinion, dated Jul. 26, 2013, in PCT/US2013/034167.
U.S. Appl. No. 13/758,928, filed Feb. 4, 2013, entitled "Methods for Forming All Tungsten Contacts and Lines."
U.S. Appl. No. 13/560,688, filed Jul. 27, 2012, entitled "Methods of improving Tungsten Contact Resistance in Small Critical Dimension Features."
U.S. Appl. No. 13/633,798, filed Oct. 2, 2012, entitled "Method for Depositing Tungsten Film With Low Roughness and Low Resistivity."
U.S. Appl. No. 13/633,502, filed Oct. 2, 2012, entitled "Method for Producing Ultra-Thin Tungsten Layers With Improved Step Coverage."
Notice of Allowance dated Dec. 3, 2012, issued in U.S. Appl. No. 13/095,734.
US Notice of Allowance, dated Oct. 4, 2012, issued in U.S. Appl. No. 13/276,170.
US Office Action, dated Jan. 7, 2013, issued in U.S. Appl. No. 12/202,126.
Notice of Allowance dated Nov. 29, 2012, issued in U.S. Appl. No. 13/244,016.
US Office Action, dated Feb. 15, 2013, issued in U.S. Appl. No. 12/755,248.
US Final Office Action, dated Nov. 16, 2012, issued in U.S. Appl. No. 13/020,748.
Korean Office Action dated Mar. 21, 2013 in KR Application No. 2010-0024905.
Korean Office Action dated Mar. 4, 2013 in KR Application No. 2010-0035449.
Korean Office Action dated Mar. 4, 2013 in KR Application No. 2010-0035453.
Chinese Office Action dated Sep. 18, 2012 issued in application No. 200980133560.1.
Korean Office Action, dated Jun. 13, 2011, issued in Application No. 2011-0032098.
Korean Second Notification of Provisional Rejection, dated Aug. 25, 2011, issued in Application No. 2004-0036346.

* cited by examiner

TUNGSTEN BARRIER AND SEED FOR COPPER FILLED TSV

FIELD OF INVENTION

The invention generally relates to electroplating technology. More specifically the invention finds application in the semiconductor industry. Even more specifically the invention relates to technology for electroplating copper onto tungsten, with particular use for electroplating copper onto tungsten for Through Silicon Via (TSV) applications.

BACKGROUND

Damascene processing is a method for forming metal lines on integrated circuits. It is often a preferred method because it requires fewer processing steps than other methods and offers a higher yield. Through silicon vias (TSV's) are sometimes used in conjunction with Damascene processing to create 3D packages and 3D integrated circuits (IC), by providing interconnection of vertically aligned electronic devices through internal wiring that significantly reduces complexity and overall dimensions of a multi-chip electronic circuit.

Conductive routes on the surface of a circuit formed during Damascene processing or in TSV's are commonly filled with copper. Unfortunately, copper presents special challenges because it readily diffuses into silicon oxide and thus reduces silicon's electrical resistance even at very low doping levels. Therefore in typical Damascene or TSV processing a conformal diffusion barrier layer is first deposited on silicon surfaces followed by a conductive seed copper layer on the diffusion barrier to aid subsequent electroplating of a copper fill layer that fills the trenches, vias and holes. This process presents certain challenges, one of which is the relatively high cost of materials, another challenge is step coverage of the barrier. Tungsten is sometimes preferred for filling TSV's, but also raises particular processing challenges.

What is needed are improved methods and materials for semiconductor processing, particularly for filling Damascene and TSV features.

SUMMARY

In one sense, the invention provides methods for filling TSV's with copper, taking advantage of some desirable properties of tungsten while avoiding many of the pitfalls of tungsten filled features. Apparatus and methods for filling through silicon vias (TSV's) with copper having an intervening tungsten layer between the copper plug and the silicon are disclosed. The tungsten layer serves as a diffusion barrier, a seed layer for copper electrofill and a means of reducing CTE-induced stresses between copper and silicon. Adhesion of the tungsten layer to the silicon and of the copper layer to the tungsten is described.

One aspect of the invention is a semiconductor processing method including: (i) receiving a semiconductor wafer including TSV holes, the TSV holes including exposed silicon surfaces as walls of the holes; (ii) depositing an adhesion layer on the exposed silicon surfaces; (iii) depositing a tungsten seed layer on the adhesion layer; and (iv) electroplating copper on the tungsten seed layer. Adhesion layers include at least one of tungsten nitride, titanium nitride, tantalum, tantalum nitride, titanium, titanium tungsten, and carbo-nitrides of titanium, tantalum and tungsten. The adhesion layer is typically, but not necessarily, thinner compared to the tungsten seed layer. Stack and graded composition structures are described. Methods of the invention also apply to Damascene processing, where one or more Damascene features are present on the substrate, with or without TSV's. The tungsten seed layer has a relatively low sheet resistance.

Tungsten seed layer/adhesion layer stacks or graded compositions are formed via one or more methods including at least one of atomic layer deposition (ALD), chemical vapor deposition (CVD), plasma vapor deposition (PVD), pulsed nucleation layer (PNL), pulsed deposition layer (PDL), plasma-enhanced ALD or CVD, and the like. In one embodiment, the stack is deposited in a single tool prior to copper electroplating.

Another aspect of the invention is a semiconductor metallization stack having interconnects, including: (i) a dielectric layer; (ii) an adhesion layer on the dielectric layer; (iii) a tungsten seed layer on the adhesion layer; and (iv) a bulk copper layer on the tungsten seed layer. Another aspect of the invention is a semiconductor device including a TSV filled with a copper plug, wherein a tungsten layer is interposed between the copper plug and the sidewall of the TSV. This device can further include an adhesion layer interposed between the tungsten layer and the sidewall of the TSV.

These and other features and advantages of the present invention will be described in more detail below with reference to the associated drawings.

DETAILED DESCRIPTION

Figure 1A:
FIG. 1A is a cross section illustrating an example semiconductor substrate before filling TSV's on the substrate with tungsten.

In the following detailed description of the present invention, numerous specific embodiments are set forth in order to provide a thorough understanding of the invention. However, as will be apparent to those skilled in the art, the present invention may be practiced without these specific details or by using alternate elements or processes. For example, embodiments of the invention are described in terms of application toward filling TSV features, however the methods described herein can be used for Damascene or other semiconductor features. In other instances well-known processes, procedures and components have not been described in detail so as not to unnecessarily obscure aspects of the present invention. One of ordinary skill in the art would appreciate that for example certain process details associated with for example ALD, CVD, PVD, electrofill and the like are intended to be part of the invention, while not necessarily described in detail so as not to obscure the salient features of the invention.

Tungsten Fill

Tungsten is often the material of choice for filling TSV features. One reason for this is the relatively low cost of tungsten versus other metals as well as the more comparable ranges of the coefficient of thermal expansion (CTE) between tungsten (approximately 5 ppm/° C. @ 20° C.) and silicon (approximately 4 ppm/° C. @ 20° C.) as for example between copper (approximately 16 ppm/° C. @ 20° C.) and silicon. There is also the fact that tungsten has less propensity to migrate into its neighboring dielectric. Additionally, tungsten exhibits higher electromigration resistance. In terms of processing, tungsten CVD produces a conformal film that can fill very high aspect ratio features. However, there are problems with using tungsten to fill TSV features.

Tungsten is commonly deposited with CVD, for example using tungsten hexafluoride precursor to deposit both a nucleation layer and a bulk fill layer. During deposition of nucleation and bulk layers, tungsten containing precursors contact the entire exposed substrate surface. As a result, tungsten deposits both inside TSV's and on a field region, which is defined as a top surface of the substrate in between TSV hole apertures. Because TSV's are relatively large features, filling TSV's leads to formation of a thick tungsten layer on the field region. To ensure complete fill of the feature, the thickness of this layer must be at least half that of the opening diameters of TSV's, which can amount to several microns thickness of tungsten. Tungsten layers on the field region deposited via CVD are typically thicker than, for example, bulk copper on a field region deposited by electroplating. This extra tungsten on the field region must be subsequently removed, for example, using chemical mechanical polishing (CMP).

Another issue with tungsten is that its use in TSV applications usually involves deposition in morphological states that have high, intrinsic residual stresses. In certain examples, compressive stresses may exceed 1 GPa. Further, although the CTE of tungsten is a closer match to that of silicon than is the CTE of copper, with bulk fill tungsten the CTE difference between tungsten and silicon can result in additional stress between the tungsten and the silicon. As a result of both intrinsic and CTE-related stresses, a substrate may bow excessively after formation of a tungsten layer on the field region especially when the substrate is cooled down.

FIG. 1A is an illustrative representation of a typical semiconductor substrate, silicon wafer 100, that is free from any compressive films deposited on its surfaces, e.g., before filling TSV's with high stress tungsten. The substrate is typically substantially flat, e.g., it bows less than 300 μm according to certain SEMI standards for a 300-mm wafer. Typically, a wafer bows very little before tungsten deposition.

In this application, certain processes and devices are described as having a layer deposited on "silicon" of a wafer substrate, for example, "TSV holes including exposed silicon surfaces as walls of the holes". It should be noted that in a typical Damascene or TSV forming process, a bare silicon wafer, with or without features, is covered with one or more thin layers of glass, silicon dioxide, that serves as an insulating layer. The one or more glass layers are formed by exposing the silicon wafer to oxygen at high temperatures and specified times depending on how thick a layer is required. For the purposes of this invention, "silicon" or "silicon surfaces" is meant to include instances where a silicon substrate has one or more silicon dioxide insulating layers thereon, that is, such substrates are included in the meaning of the term "silicon wafer," "silicon substrate," "silicon surfaces" and the like.

Figure 1B:
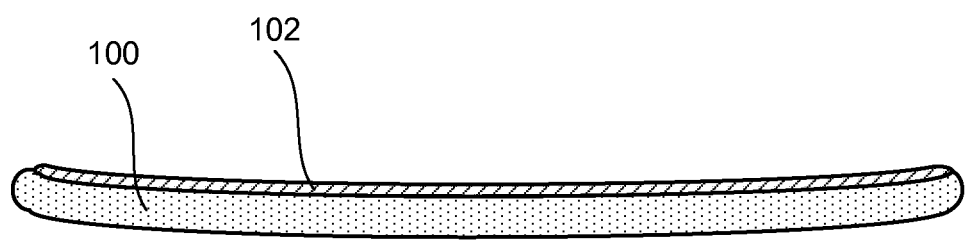
FIG. 1B illustrates the substrate from FIG. 1A after filling TSV's on the substrate with tungsten and resultant bowing due to stress from the tungsten layer.

As explained above, filling TSV's leads to formation of a tungsten layer 102 on a field region. Layer 102 is also referred to as an initial tungsten layer to distinguish it from modified states of this layer, for example, an etched tungsten layer. The residual stress is transferred from the initial tungsten layer 102 to the substrate 100 and can cause bowing of the entire stack, the substrate 100 and the layer 102, as for example illustrated in FIG. 1B. As mentioned above, bowing generally becomes more severe during substrate cooling, for example, during substrate removal from a processing apparatus and prior to further processing.

Figure 1C:
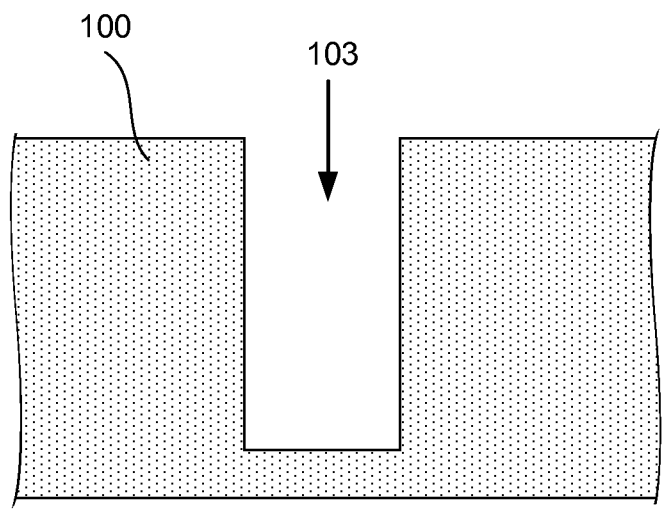
FIGS. 1C and 1D illustrate a portion of a substrate before and after TSV filling exemplifying a filled TSV and an initial tungsten layer formed on the field region.
Figure 1D:
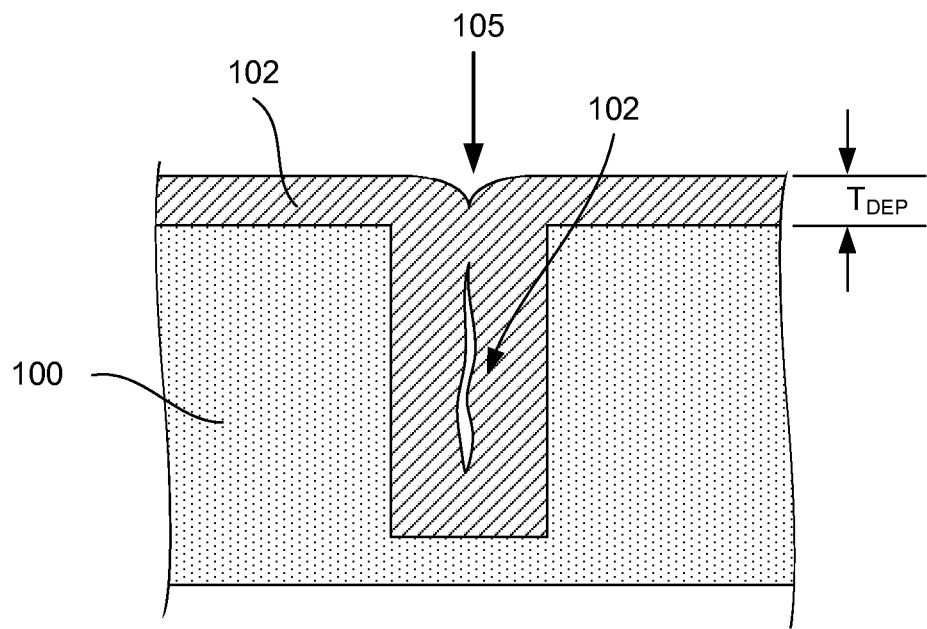

FIG. 1C illustrates a cross sectional portion, 101, of substrate 100 with an empty TSV, 103, while FIG. 1D shows TSV 103 filled with tungsten via typical CVD processing. Filling leads to formation of the initial tungsten layer 102 on the field region of the substrate. Layer 102 may have slight indentations 105 above the filled TSV. These indentations are formed during TSV "closing" due to the conformal nature of CVD tungsten deposition and the high aspect ratio of TSV's. Another issue with CVD tungsten's conformal nature are voids, 107, that occur when the growing thickness of the conformal tungsten layer during deposition causing premature closure of the TSV hole prior to complete fill. These issues require that tungsten be deposited to sufficient thickness to ensure the TSV is completely filled. The initial tungsten layer is shown to have an average thickness $T_{DEP}$, which generally depends on the opening diameters of the largest TSV in substrate 100, but as mentioned is generally thicker than, for example, a layer of electrofill copper on the field would be when filling comparable features.

One way to address this problem of excess tungsten and its associated stress issues is via removal of the bulk tungsten layer on the field region via CMP. One exemplary method of removing this unwanted tungsten bulk is described in U.S. patent application Ser. No. 12/534,566, filed Aug. 3, 2009, entitled, "Thinning Tungsten Layer after Through Silicon Via Filling" by Anand Chandrashekar et al., which is incorporated by reference herein for all purposes. Although improved methods of removal of the bulk tungsten on the field are important, there still is a need to address the use of bulk tungsten fill rather than, for example, copper.

Copper Fill

Copper has many desirable properties not the least of which is copper electrofill is very well characterized and controllable. With copper electrofill, void-free filling is readily achieved and with less field copper to subsequently remove. Less field copper is desirable due to reduced cost of removal and a larger variety of well characterized removal methods, for example, as compared to tungsten. One issue that must be overcome however is the propensity of copper to migrate into the neighboring dielectric. One way to mitigate copper migration is using a diffusion barrier layer.

Diffusion Barriers

It should be understood that diffusion barrier layers designed to prevent migration of copper (or other materials) into dielectric are commonly composed of materials, for example from the refractory metals group, such as tantalum, tantalum nitride, tungsten, titanium, titanium tungsten, titanium nitride, and the like. Such materials provide excellent barrier properties and they are well suited for layering via plasma vapor deposition (PVD) or atomic layer deposition (ALD). However, barrier materials are often costly, with the exception of tungsten-based materials which are cost effective compared with other barrier materials. So, it is desirable to use tungsten or a tungsten-based barrier material. However, embodiments of the present invention are not limited to tungsten-based barrier layers. Any of the above described, or other, suitable copper diffusion barrier materials would work.

For the purposes of this invention, materials as described for use as barrier layers are also referred to as "adhesion" layers. These terms may be used interchangeably, but for the purposes of this invention the ability of the barrier layer to aid in its adherence to its adjoining layers is why the term "adhesion layer" is used. This is because an object of the invention is not only to utilize a barrier layer with copper fill in a TSV, but also to use a tungsten seed layer on which to electroplate the copper fill. The inventors have found that CVD tungsten often does not adhere well to silicon (and insulating layers such as $SiO_2$), therefore it is desirable to deposit a barrier layer that adheres well to the silicon. Adhesion barriers of the invention can also provide a surface for proper adhesion of the tungsten seed layer deposited on the adhesion layer. So, the adhesion layer's role can be dual purpose in terms of adhesion of adjoining layers. Thus, any of the above materials described for barrier layers would make acceptable adhesion layers because tungsten, for example CVD tungsten, adheres to them. Tungsten based materials, e.g., tungsten nitride, may be preferable due to cost considerations and tight control available via ALD.

One reason that CVD tungsten doesn't adhere well to silicon is that the fluorides created as a result of the CVD processing, for example when using $WF_6$ as a precursor, etch silicon. One way to circumvent this issue is the use of "fluoride free" CVD tungsten, as described in U.S. patent application Ser. No. 11/963,698, filed Dec. 21, 2007, entitled "Methods for Forming All Tungsten Contacts and Lines," by Raashina Humayun et al., which is incorporated by reference herein for all purposes. One embodiment of the invention, described in more detail below, includes a fluoride free adhesion layer. In one embodiment, the adhesion layer and the tungsten seed layer are a single layer of fluoride free tungsten. Stack and single layer embodiments are also described in more detail below.

Copper Fill with Tungsten Seed Layer

When using tungsten-based layers, PVD could be used to deposit a copper seed layer on top of, e.g., a tungsten-based barrier or seed layer. For Damascene structures the use of PVD copper seed films followed by electroplating has been successful at feature dimensions as small as about 30 nm. For TSV's, a copper seed layer may be also be deposited using PVD. One problem, however, is that the copper seed layer field thicknesses which are required to provide continuous copper coverage on the sidewalls of vias are typically between 500 and 2000 nm. This is much thicker than the 20-80 nm copper seed used for Damascene electroplating. The cost of the copper seed deposition increases almost linearly with thickness, so the PVD seed deposition process for TSV wafers can cost over $10 per wafer. Also, CVD copper could be used but this requires complex and expensive precursors. On the contrary, electroplating seed copper for TSV's is much more cost effective and, as mentioned above, bulk fill copper electroplate and removal of field copper are well characterized.

For at least the reasons above, it would be advantageous to utilize copper electroplate (rather than PVD or CVD) on tungsten, however, this has been problematic due to copper not adhering to tungsten effectively; the oxides present on the tungsten surface make electroplating adherent copper seed on the tungsten problematic. Most surface treatments of tungsten fail to reduce or remove the oxides or actually strongly attack the tungsten itself. Recently however, methods and apparatus for electroplating adherent copper onto tungsten have been developed as described in U.S. patent application Ser. No. 12/649,237, by Jonathan Reid et. al., entitled, "Methods and Apparatus for Depositing Copper onto Tungsten" which is incorporated by reference herein for all purposes.

The inventors have found that by combining technology to adhere barrier layers to silicon, for example tungsten-based barrier layers, with technology to form adherent copper films on tungsten, improved methods and devices are realized. The inventors have found, especially for TSV features, that depositing a tungsten layer of sufficient thickness and then electrofilling with copper serves many beneficial and synergistic purposes. First, the tungsten layer buffers the CTE induced stress between the copper electrofill and the silicon, thus taking advantage of one desirable property of tungsten, specifically, a similar CTE to that of silicon. Second, besides copper being an excellent conductor, there is less CMP needed to remove the excess field copper as compared to CVD tungsten filled features, because there is less copper deposited on the field due to non-conformal methods and copper is easier to remove via CMP and/or the CMP methods for copper are more well characterized. Third, tungsten has a low sheet resistance and therefore serves not only as a CTE-induced stress buffer, but also as a good seed layer. Fourth, tungsten continues to fill a necessary role as a diffusion barrier, with or without an additional non-tungsten based diffusion barrier.

Figure 2:
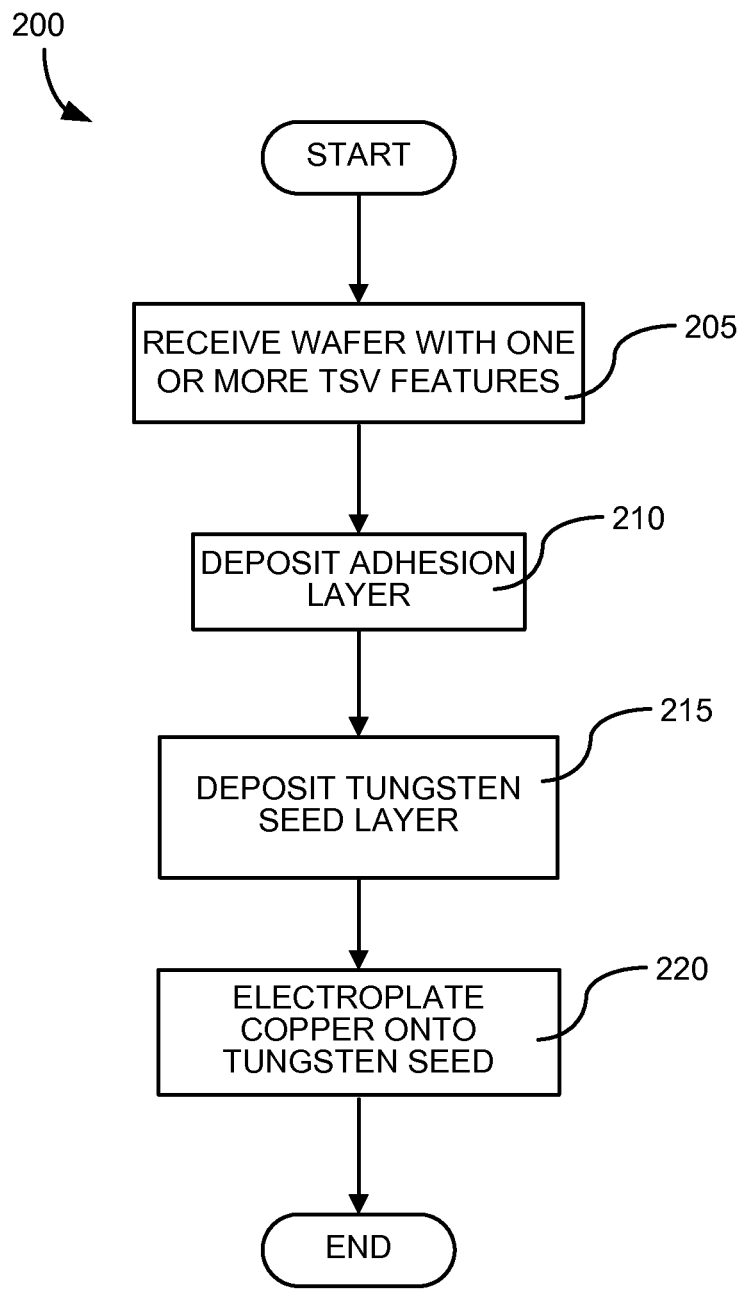
FIG. 2 is a process flow in accord with methods of the invention.

Thus one aspect of the invention is a semiconductor processing method including: (i) receiving a semiconductor wafer having TSV holes, the TSV holes including exposed silicon surfaces as walls of the holes; (ii) depositing an adhesion layer on the exposed silicon surfaces; (iii) depositing a tungsten seed layer on the adhesion layer; and (iv) electroplating copper on the tungsten seed layer. FIG. 2 depicts a process flow, 200, in accord with embodiments of the invention. A wafer having one or more TSV features is received, see 205. Then, an adhesion layer is deposited, see 210. In one embodiment, the adhesion layer includes at least one of tungsten nitride, titanium nitride, tantalum, tantalum nitride, titanium, titanium tungsten, and carbo-nitrides of titanium, tantalum and tungsten. Typically, but not necessarily, the adhesion layer is thinner than the subsequently deposited tungsten seed layer. In one embodiment, the adhesion layer is between about 1 Å and about 500 Å thick; in another embodiment, between about 5 Å and about 200 Å thick; in another embodiment, between about 10 Å and about 100 Å thick.

In one embodiment, optionally, a nucleation layer is deposited on the adhesion layer prior to deposition of the tungsten seed layer. For example, a nucleation layer of tungsten, between about 25 Å and about 75 Å, is deposited using pulsed nucleation ($SiH_4$—$WF_6$). In one embodiment the nucleation layer is about 50 Å thick. The nucleation layer serves to aid nucleation of the tungsten seed layer on the adhesion layer. In this example, the nucleation layer is tungsten, but other metals can be used without escaping the scope of the invention.

As mentioned, next a tungsten seed layer is deposited on the adhesion layer, see 215. In one embodiment, the tungsten seed layer is between about 100 Å and about 5000 Å thick; in another embodiment, the tungsten seed layer is between about 100 Å and about 3000 Å thick; in yet another embodiment, the tungsten seed layer is between about 500 Å and about 1000 Å thick. In one embodiment, the sheet resistance of the tungsten seed layer is between about 0.1 $\Omega$/sq and about 1000 $\Omega$/sq; in another embodiment, between about 0.5 $\Omega$/sq and about 200 $\Omega$/sq; and in yet another embodiment, between about 2 $\Omega$/sq and about 50 $\Omega$/sq.

In one embodiment, the adhesion layer is deposited using at least one of atomic layer deposition (ALD), chemical vapor deposition (CVD), plasma vapor deposition (PVD), pulsed nucleation layer (PNL), pulsed deposition layer (PDL), plasma-enhanced ALD and plasma-enhanced CVD. In one embodiment, the tungsten seed layer is deposited using at least one of ALD, CVD and PVD. In one embodiment, the adhesion layer is deposited using ALD, and the tungsten seed layer is deposited using CVD. In another embodiment, where ALD is used, the ALD includes fluorine-free deposition and the adhesion layer includes tungsten. In another embodiment, the adhesion layer is deposited using CVD, and the tungsten seed layer is deposited using CVD. In another embodiment, the adhesion layer is deposited using PVD, and the tungsten seed layer is deposited using CVD. In yet another embodiment, the adhesion layer is deposited using ALD, and the tungsten seed layer is deposited using ALD. In one embodiment, depositing the adhesion layer and electroplating copper thereon are performed in a single semiconductor processing tool, for example all CVD deposition, or for example, all ALD deposition. This has great advantages related to reduced process time, steps, cost and throughput.

Figure 3A:
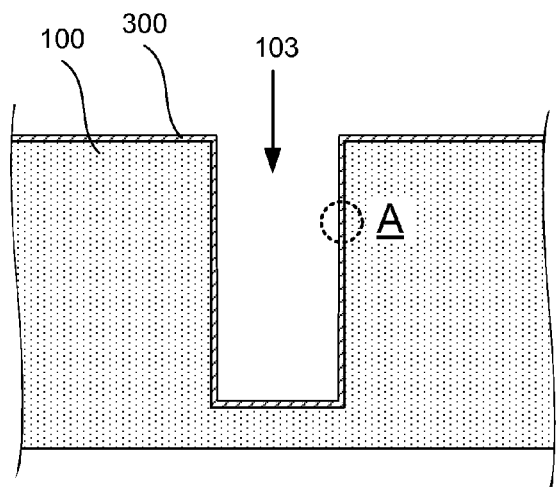
FIGS. 3A-B illustrate a TSV feature after depositing an adhesion layer and a tungsten seed layer.
Figure 3B:
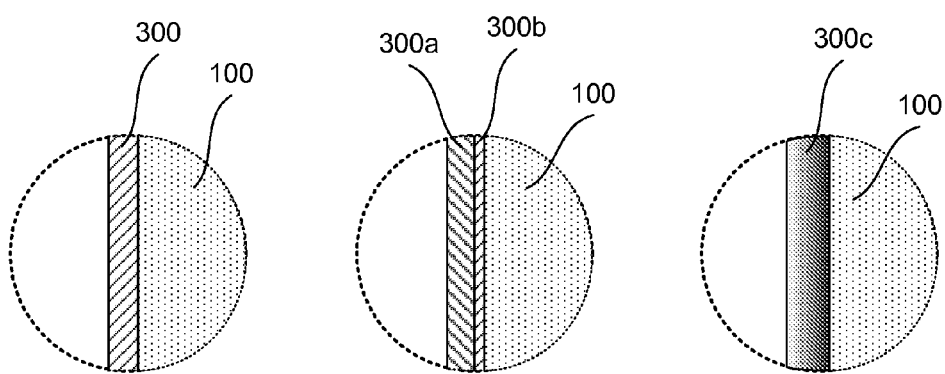

FIG. 3A depicts TSV feature 103 with the adhesion layer and the tungsten seed layer deposited as a stack, 300, conformally over the surface of the substrate silicon, 100. In this depiction, a single layer is shown to show the relative thickness of stack 300 compared to the copper fill that will go into the TSV on top of stack 300. FIG. 3B depicts three variations of layer 300, as expanded versions of region A denoted in FIG. 3A. In one embodiment, a single material is used, for example fluoride free tungsten, which has superior adhesion properties and can be used as a seed. In another embodiment, a distinct tungsten seed layer, 300a, is deposited on top of adhesion layer 300b. In another embodiment, a graded composition material layer, 300c, is formed, for example, where tungsten nitride is deposited followed by gradually reducing nitride forming source gas so that a graded composition layer 300c is formed. Graded composition layer 300c serves as an adhesion layer and seed layer, as a graded composition between the silicon interface and the tungsten interface. With methods of the invention, the problems associated with thicker tungsten fill are avoided by keeping the tungsten seed and adhesion layer relatively thin, while taking advantage of the desirable properties of tungsten as a seed layer and, optionally, an adhesion layer material. One of ordinary skill in the art would appreciate that additional layers may be used in the tungsten and/or adhesion layer to form a suitable stack without escaping the scope of the present invention. In one embodiment, at least one additional layer of material is deposited on the tungsten seed layer prior to electroplating copper, the at least one additional layer including at least one of titanium nitride, tungsten nitride, cobalt, ruthenium and copper. Layers including cobalt and copper may include alloys of cobalt and copper. In one such embodiment, a titanium nitride adhesion layer is deposited via CVD, then a tungsten nitride layer via ALD, and finally fluoride free tungsten seed via ALD. In this example, the titanium nitride/tungsten nitride layers form a dual adhesion layer (collectively for the purposes of the invention "the adhesion layer"). This dual adhesion layer approach can be used to address resistivity issues with particular materials, for example forming a "buffer" layer between titanium nitride and tungsten seed layer.

Referring again to FIG. 2, process flow 200, after the tungsten seed layer is deposited copper is electroplated onto the tungsten seed layer, see 220. The copper can be deposited in a single process to bulk fill, or alternatively, a copper seed layer can be deposited using chemistries optimal for copper seed deposition, followed by chemistries more well suited for bulk copper fill. Thus, a specific embodiment of the invention is a semiconductor processing method including: (i) providing a semiconductor wafer including one or more TSV holes; (ii) depositing a adhesion layer between about 10 Å and about 100 Å thick on the semiconductor wafer; (iii) depositing a tungsten seed layer between about 500 Å and about 1000 Å thick on the adhesion layer; and (iv) electroplating bulk fill copper on the tungsten seed layer until the one or more TSV holes are filled with copper. The bulk copper fill may be performed in a single step or in a two step process with copper seed specific chemistry followed by bulk fill specific chemistry. In one embodiment, (ii) and (iii) are performed in a single semiconductor processing tool, for example all CVD deposition, or for example, all ALD deposition.

In a specific embodiment, copper is electroplated on the tungsten seed layer using methods and apparatus as described in U.S. patent application Ser. No. 12/649,237 as identified above. Generally, methods described in that application include (i) providing a semiconductor wafer having a tungsten layer thereon; (ii) exposing the tungsten layer to an acidic medium, the acidic medium substantially free of copper ions; (iii) applying a negative current density to the tungsten layer; (iii) introducing copper ions to the acidic medium; and (iv) electroplating a copper layer onto the tungsten layer. Pretreating the tungsten layer with an acidic medium, and then applying a negative current density to the tungsten layer, especially while the tungsten layer is exposed to the acidic medium, prepares the tungsten layer for copper electrodeposition with good adherence.

Figure 3C:
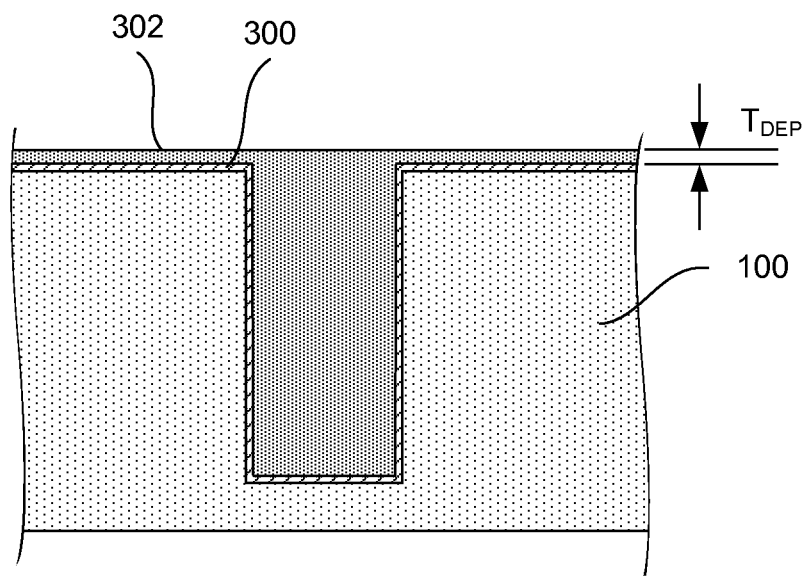
FIGS. 3C-D illustrate a copper filled TSV before and after removing copper from the field region of the silicon.
Figure 3D:
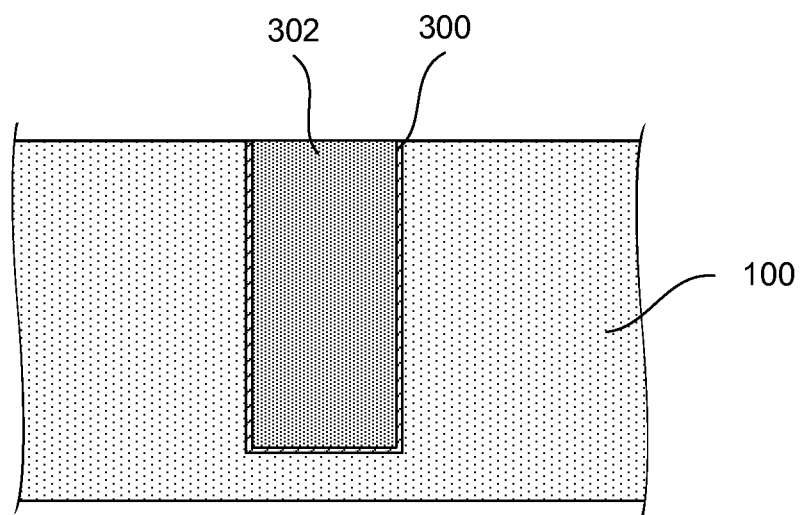
Figure 3E:
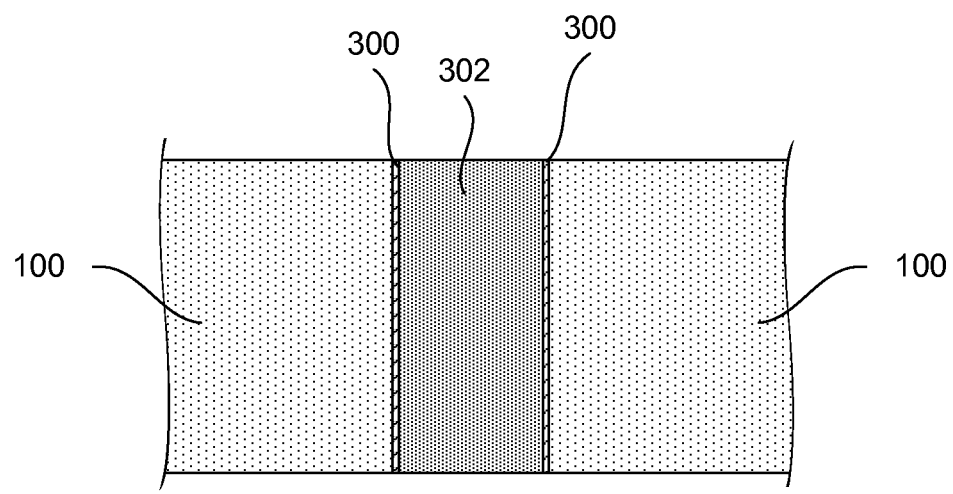
FIGS. 3E-F illustrate a copper filled TSV after removing silicon from the side opposite the copper fill to expose the copper plug on both sides of the wafer.
Figure 3F:
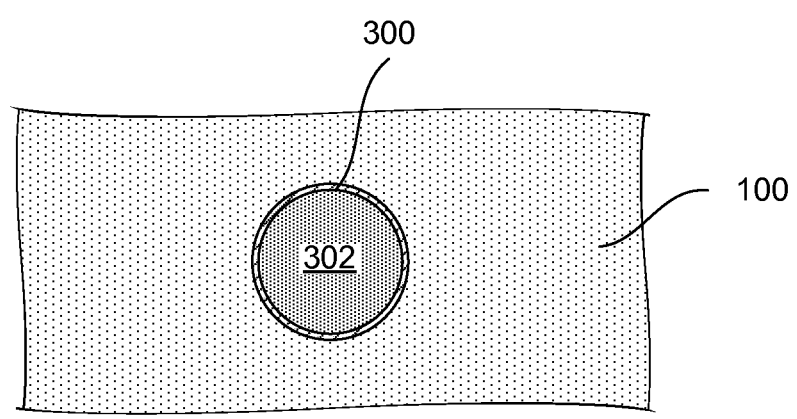

FIG. 3C depicts semiconductor substrate 100, with copper electroplate 302 filling the TSV (on layer 300 as described above) with additional copper on the field region. One embodiment of the invention is a semiconductor metallization stack having interconnects, including: (i) a dielectric layer; (ii) an adhesion layer on the dielectric layer; (iii) a tungsten seed layer on the adhesion layer; and (iv) a bulk copper layer on the tungsten seed layer. As noted, with methods of the invention there is less metal $T_{DEP}$ to be removed from the field region than with tungsten-filled TSV's. In one embodiment, the method further includes performing CMP to remove copper from the surface of the semiconductor wafer including the one or more TSV holes until the resultant copper plugs filling the one or more TSV holes are exposed along with the field region of silicon, see FIG. 3D. In some embodiments, the resultant structure is used as a base for 3D packaging where this base substrate serves as interconnector for devices stacked on top of it. In other embodiments, the method further includes removing material from the surface of the semiconductor wafer not (originally) including the one or more TSV apertures until the resultant copper plugs are exposed, see FIG. 3E. In this example, the excess silicon and the portion of the seed/adhesion layer(s) that was at the bottom (as depicted) of the TSV feature is removed to reveal the copper plug on that side of the wafer. FIG. 3F shows what the substrate wafer would look like from either surface once the copper fill is removed from one side and silicon and tungsten layers are removed from the opposite side to expose the copper plug filling the TSV. Note in FIGS. 3E and 3F that the resulting structure is a copper plug in a TSV with an intervening tungsten layer (layer 300 as described above) interposed between copper plug 302 and the sidewall of the TSV.

In accord with the description above, layer 300 can include a tungsten seed and an adhesion layer, thus one embodiment is a semiconductor device with a copper plug in a TSV with an intervening tungsten layer further including an adhesion layer interposed between the tungsten layer and the sidewall of the TSV. Again, layer 300 can also be a graded composition, e.g., of tungsten and tungsten nitride. Three or other multiple layer stacks, that include a tungsten seed layer, are also within the scope of the devices of the invention so long as there is a tungsten layer interposed between the silicon and the copper plug.

Controllers—Software

In certain embodiments, a controller is employed to control process conditions, for example via the set of instructions in an apparatus, for example apparatus for carrying out ALD, CVD, PVD, electrofill and the like. The controller typically includes one or more memory devices and one or more processors. The processor may include a CPU or computer, analog and/or digital input/output connections, stepper motor controller boards, etc. In certain embodiments, the controller controls all of the activities of the plating apparatus of the invention. The controller executes control software including sets of instructions for controlling the timing of the processing operations, flow rates, temperatures, voltages, etc. Typically, there will be a user interface associated with the controller. The user interface may include a display screen, graphical software displays of the apparatus and/or process conditions, and user input devices such as pointing devices, keyboards, touch screens, microphones, etc.

A computer program code for controlling the processing operations can be written in any conventional computer readable programming language: for example, assembly language, C, C++, Pascal, Fortran or others. Compiled object code or script is executed by the processor to perform the tasks identified in the program. The controller parameters relate to process conditions such as, for example, timing of the processing steps, flow rates and temperatures of precursors and inert gases, temperature of the substrate, pressure of the chamber and other parameters of a process. These parameters are provided to the user in the form of a recipe, and may be entered utilizing the user interface. Monitoring the process may be provided by analog and/or digital input connections of the controller.

The software may be designed or configured in many different ways. For example, various chamber component subroutines or control objects may be written to control operation of the chamber components for carrying out the inventive deposition processes. Examples of programs or sections of programs for this purpose include substrate timing of the processing steps code, flow rates, voltages and temperatures of electrolytes, reagents and inert gases code and the like.

Thus one embodiment of the invention is a controller, programmed with a set of instructions, for carrying out a method of the invention as described herein.

EXPERIMENTAL

A substrate silicon wafer having Damascene features was first annealed in the presence of oxygen to form a silicon dioxide insulating layer thereon. Then a 50 Å tungsten nitride adhesion layer was deposited using pulse nucleation ($B_2H_6$—$WF_6$—$NH_3$). Next, a nucleation layer of tungsten, 50 Å, was deposited using pulsed nucleation ($SiH_4$—$WF_6$). Then, a CVD tungsten seed layer was deposited to a thickness of 100 Å ($WF_6$—$H_2$).

In this example, the substrate with the tungsten layer was then placed in degassed 1M sulfuric acid for 4 minutes at room temperature. A current density of 80 mA/cm$^2$ is applied to the tungsten layer for about 15 seconds. With the current still applied, copper ions are introduced by adding a degassed copper sulfate solution to make a final copper ion concentration of 0.1M. The current density was maintained at 80 mA/cm$^2$ for another 15 seconds. The current is ceased and the wafer transferred to a bulk fill copper electrolyte bath containing 10 g/L sulfuric acid, 40 g/L cupric ion added as copper sulfate, 50 mg/L chloride ion, and 9 ml/L, 2 ml/L, and 3 ml/L respectively of Viaform Extreme Accelerator, Suppressor, and Leveler additives and was carried out at a current density of 10 mA/cm$^2$.

Figure 4:
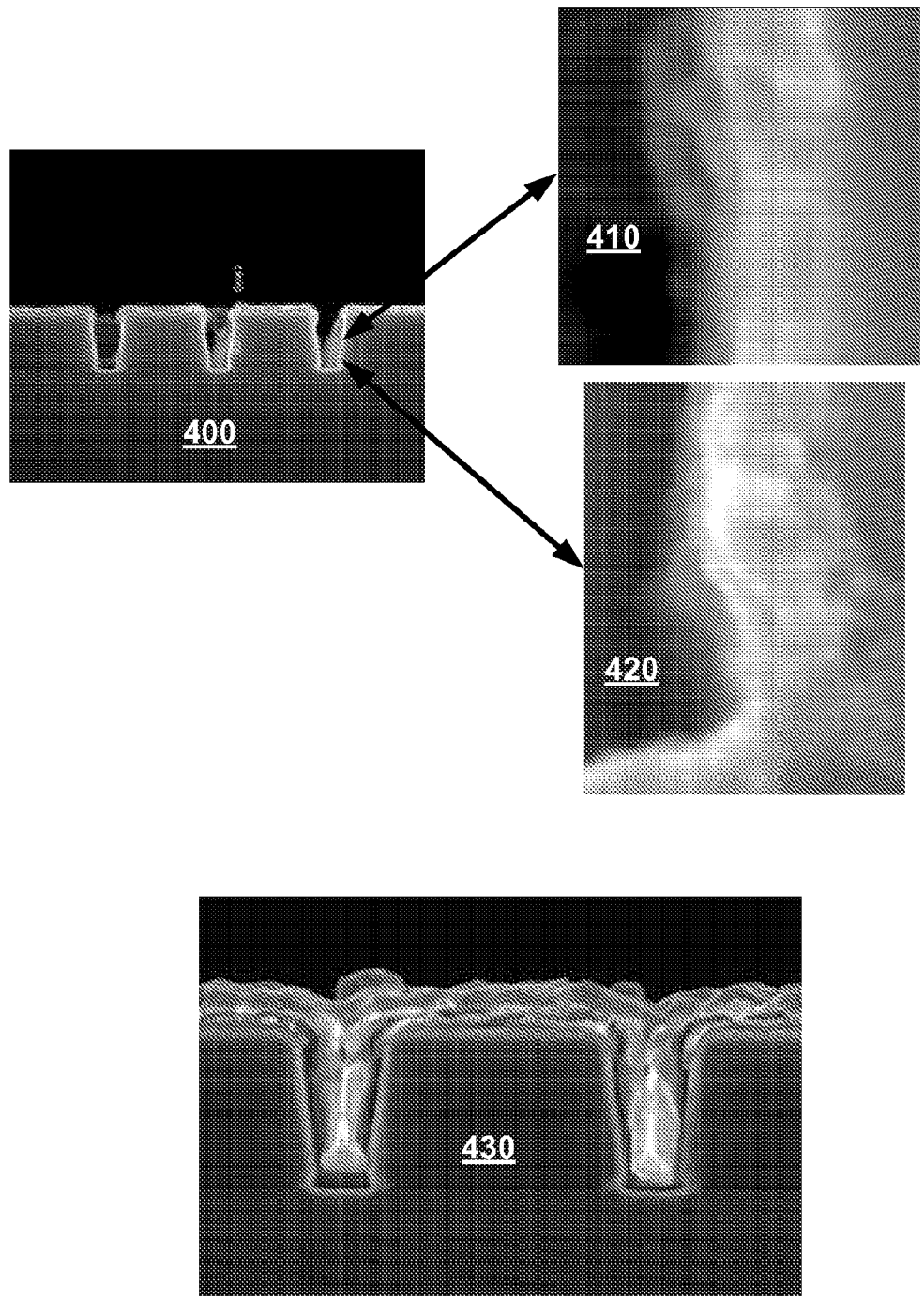
FIG. 4 shows cleave/SEM images of damascene features initially coated with 20 nm tungsten, seeded with copper and then bulk filled.

FIG. 4 shows cleave/SEM images of the 0.2×0.5 micron damascene features initially coated with 20 nm tungsten (combined adhesion, nucleation and seed layers), seeded with copper and then bulk filled (bottom SEM). Images of the copper seed coverage before filling are shown, see 400, and indicate seed thickness in the feature varied between about 3 nm on the sidewall, see 410, and about 7 nm on the bottom, see 420. The filled features are shown as well, see 430.

Figure 5:
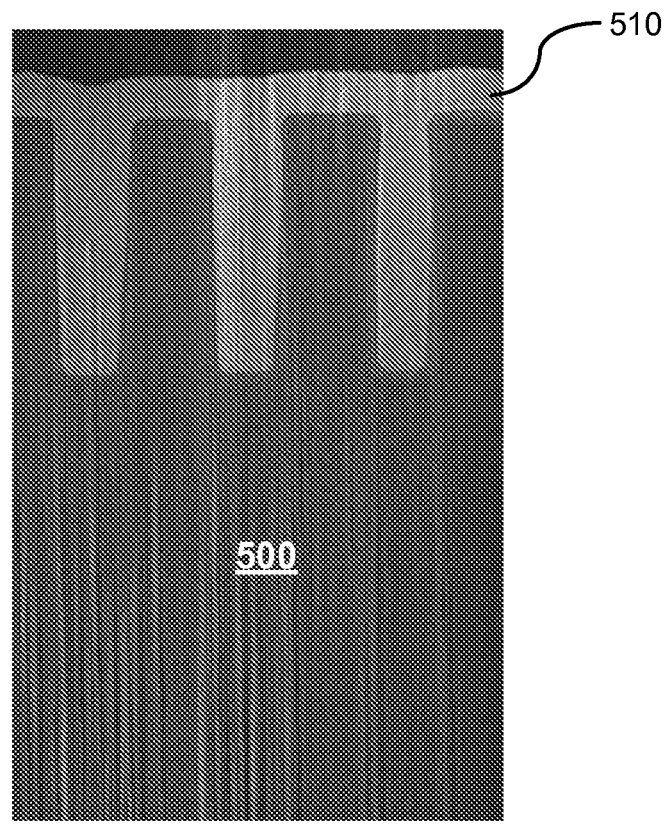
FIG. 5 shows an SEM image of TSV's following filling using methods described herein.

FIG. 5 shows a SEM image of 5×20 micron TSV's following filling using the processes described herein. The TSV was initially coated with 50 nm tungsten as a 50 Å adhesion layer deposited by pulsed nucleation ($B_2H_6$—$WF_6$—$NH_3$), a 50 Å nucleation layer deposited by pulsed nucleation ($SiH_4$—$WF_6$) and a 400 Å CVD tungsten seed layer ($WF_6$—$H_2$).

In this example, the wafer, 500, was immersed in degassed 1M sulfuric acid for 4 minutes, a current of 40 mA/cm2 was applied for about 20 seconds, 0.03 M cupric ion was added to the solution and a current of 40 mA/cm$^2$ was applied for 2.0 seconds and then a current of 2 mA/cm$^2$ was applied for 180 seconds to form a copper film, 510, of approximately 100 nm in thickness on the wafer field.

While this invention has been described in terms of a few preferred embodiments, it is not limited to the specifics presented above. Many variations on the above-described preferred embodiments, may be employed. Therefore, the invention should be interpreted with reference to the following claims.

What is claimed is:

1. A semiconductor processing method comprising:
   (i) receiving a semiconductor wafer comprising through silicon via (TSV) holes;
   (ii) depositing an adhesion layer on an exposed surface of the received semiconductor wafer;
   (iii) depositing a tungsten seed layer on the adhesion layer; and
   (iv) electroplating copper on the tungsten seed layer to deposit copper at least within the TSV holes, wherein prior to the copper electroplating, the tungsten seed layer is electrically biased and is exposed to an acidic medium, the acidic medium being substantially free from copper ions.

2. The method of claim 1, wherein the adhesion layer comprises a material selected from the group consisting of tungsten nitride, titanium nitride, tantalum, tantalum nitride, titanium, titanium tungsten, titanium carbo-nitride, tantalum carbo-nitride and tungsten carbo-nitride.

3. The method of claim 2, wherein the adhesion layer is between about 1 Å and about 500 Å thick.

4. The method of claim 3, wherein the tungsten seed layer is between about 100 Å and about 5000 Å thick.

5. The method of claim 4, wherein the sheet resistance of the tungsten seed layer is between about 0.1 Ω/sq and about 1000 Ω/sq.

6. The method of claim 2, wherein the adhesion layer is between about 5 Å and about 200 Å thick.

7. The method of claim 2, wherein the adhesion layer is between about 10 Å and about 100 Å thick.

8. The method of claim 3, wherein the tungsten seed layer is between about 100 Å and about 3000 Å thick.

9. The method of claim 3, wherein the tungsten seed layer is between about 500 Å and about 1000 Å thick.

10. The method of claim 4, wherein the sheet resistance of the tungsten seed layer is between about 0.5 Ω/sq and about 200 Ω/sq.

11. The method of claim 4, wherein the sheet resistance of the tungsten seed layer is between about 2 Ω/sq and about 50 Ω/sq.

12. The method of claim 4, wherein the adhesion layer is deposited using a method selected from the group consisting of ALD, CVD, PVD, PNL, PDL, plasma-enhanced ALD and plasma enhanced-CVD.

13. The method of claim 12, wherein the tungsten seed layer is deposited using a method selected from the group consisting of ALD, CVD and PVD.

14. The method of claim 13, wherein the adhesion layer is deposited using ALD, and the tungsten seed layer is deposited using CVD.

15. The method of claim 14, wherein the ALD comprises fluorine-free deposition and the adhesion layer comprises tungsten.

16. The method of claim 13, wherein the adhesion layer is deposited using PNL, and the tungsten seed layer is deposited using CVD.

17. The method of claim 13, wherein the adhesion layer is deposited using PVD, and the tungsten seed layer is deposited using CVD.

18. The method of claim 13, wherein the adhesion layer is deposited using ALD, and the tungsten seed layer is deposited using ALD.

19. The method of claim 13, wherein electroplating copper on the tungsten seed layer comprises a bulk fill copper electroplating process.

20. The method of claim 13, wherein a tungsten nucleation layer is deposited on the adhesion layer prior to deposition of the tungsten seed layer.

21. The method of claim 13, wherein the adhesion layer is deposited in a manner so as to provide a graded composition between interface of the adhesion layer with the tungsten seed layer and the interface of the adhesion layer with the surface onto which the adhesion layer was deposited in (ii).

22. A semiconductor processing method comprising:
(i) providing a semiconductor wafer comprising one or more TSV holes;
(ii) depositing an adhesion layer between about 10 Å and about 100 Å thick on the semiconductor wafer;
(iii) depositing a tungsten seed layer between about 500 Å and about 1000 Å thick on the adhesion layer; and
(iv) electroplating bulk fill copper on the tungsten seed layer until the one or more TSV holes are filled with copper, wherein prior to the copper electroplating, the tungsten seed layer is electrically biased and is exposed to an acidic medium, the acidic medium being substantially free from copper ions.

23. The method of claim 22, wherein (ii) and (iii) are performed in a single semiconductor processing tool.

24. The method of claim 23, further comprising after (iv) performing CMP to remove copper from a first surface of the semiconductor wafer until the resultant copper plugs filling the one or more TSV holes are exposed.

25. The method of claim 24, further comprising removing material from a second surface of the semiconductor wafer, wherein the second surface is on the opposite side of the semiconductor wafer from the first surface, until the resultant copper plugs are exposed, thereby forming a structure having copper plugs exposed at both the first and second surfaces.

* * * * *